(12) United States Patent
Chen et al.

(10) Patent No.: US 10,475,975 B2
(45) Date of Patent: Nov. 12, 2019

(54) FRAME, LIGHT-EMITTING DEVICE USING THE SAME, AND METHOD FOR MANUFACTURING THE SAME

(71) Applicant: Lextar Electronics Corporation, Hsinchu (TW)

(72) Inventors: Dao-Wei Chen, New Taipei (TW); Huang-Yi Lin, Hsinchu (TW); Kun-Jung Wu, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/889,223

(22) Filed: Feb. 6, 2018

(65) Prior Publication Data
US 2018/0240953 A1   Aug. 23, 2018

(30) Foreign Application Priority Data

Feb. 17, 2017 (TW) .............................. 106105350 A

(51) Int. Cl.
*H01L 33/00* (2010.01)
*H01L 33/62* (2010.01)
*H01L 33/48* (2010.01)

(52) U.S. Cl.
CPC ............ *H01L 33/62* (2013.01); *H01L 33/486* (2013.01); *H01L 2933/0033* (2013.01); *H01L 2933/0066* (2013.01)

(58) Field of Classification Search
CPC ..................................................... H01L 33/62
USPC .......................................................... 257/99
See application file for complete search history.

(56) References Cited

U.S. PATENT DOCUMENTS

| 2007/0105334 A1* | 5/2007 | Jang | ....................... H01L 27/105 438/396 |
| 2011/0210354 A1* | 9/2011 | Ichikawa | ............ B29C 45/0055 257/98 |

FOREIGN PATENT DOCUMENTS

| CN | 101578712 A | 11/2009 |
| CN | 102144306 A | 8/2011 |
| CN | 204179103 U | 2/2015 |
| CN | 204289511 U | 4/2015 |
| CN | 104752579 A | 7/2015 |
| TW | 201403882 A | 1/2014 |
| TW | 201526308 A | 7/2015 |
| TW | I525848 B | 3/2016 |
| TW | M524560 U | 6/2016 |

\* cited by examiner

*Primary Examiner* — Ajay Arora
(74) *Attorney, Agent, or Firm* — CKC & Partners Co., LLC

(57) ABSTRACT

A frame includes first and second leads and a body. The first and second leads contain a metal material. The body contains a non-metal material and has first and second side surfaces. The first and second leads are covered with the body. The first and second leads extend in a first direction to outwardly protrude from the body. The first and second side surfaces are respectively abutted against two ends of the protruding first lead and respectively slanted to the two ends of the protruding first lead by a first angle θ1 and a second angle θ2, which are defined by the following relationship, θ1≠0° and the θ1≠180°, and the θ2≠0° and the θ2≠180°. The substance between any two points in each of the first and second side surfaces is non-metal.

12 Claims, 7 Drawing Sheets

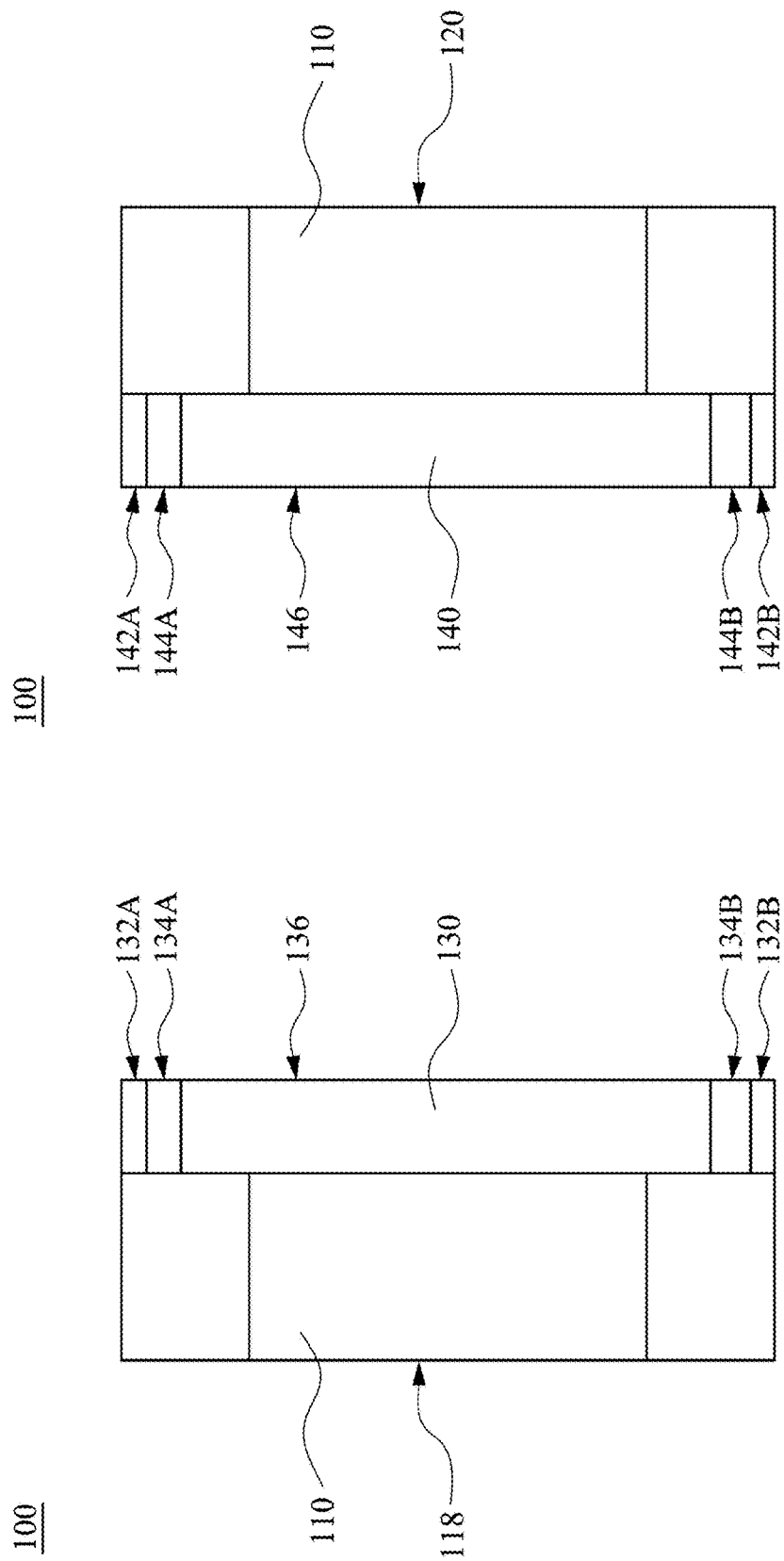

FRAME, LIGHT-EMITTING DEVICE USING THE SAME, AND METHOD FOR MANUFACTURING THE SAME

RELATED APPLICATIONS

This application claims priority to Taiwanese Application Serial Number 106105350, filed Feb. 17, 2017, which is herein incorporated by reference.

BACKGROUND

Technical Field

The present disclosure relates to a frame, a light-emitting device using the same, and a method for manufacturing the same.

Description of Related Art

In recent years, light-emitting diodes (LEDs) have been widely used in common and commercial lighting applications. When being used as light sources, the LEDs have many advantages including low power consumption, long service life, small size, and fast switching speed. Hence, conventional illumination sources, such as incandescent light sources have been gradually replaced by LED light sources. Accordingly, the LED light sources have been assembled with different products for applications. During the steps of assembling an LED light source, the LED light source can be arranged on a frame, and then the frame with the LED light source arranged thereon is disposed on a circuit board. In this regard, a bonding relationship among the LED light source, the frame, and the circuit board may correlate with yield rate and performance of the resulting product.

SUMMARY

An aspect of the present disclosure provides a frame configured to carry a light-emitting component, thereby serving to protect the light-emitting component. The frame includes a first lead, a second lead, and a body. The body contains a non-metal material, and the first and second leads contain a metal material. The first and second leads are covered with the body. The body has an opening, a first side surface, and a second side surface, in which the first and second side surfaces are located at two opposite sides of the opening. The substance between any two points in each of the first and second side surfaces is non-metal, thereby enhancing the wrapping strength of the body with respect to the first and second leads. Furthermore, the first and second side surfaces of the body are abutted against ends of the first and second leads, and each of abutments is not a straight angle, thereby enhancing the bonding strength of an adhesive with respect to the frame.

An aspect of the present disclosure provides a frame including a first lead, a second lead, and a body. The first and second leads contain a metal material. The body contains a non-metal material and has an opening, a first side surface, and a second side surface. The first and second leads are covered by the body. A portion of the first lead and a portion of the second lead are exposed from the opening. The first and second leads extend in a first direction to outwardly protrude from the body. The first and second side surfaces are located at two opposite sides of the opening. The first and second side surfaces are respectively abutted against two ends of the protruding first lead with a first angle $\theta 1$ and a second angle $\theta 2$. The $\theta 1 \neq 0°$ and the $\theta 1 \neq 180°$, and the $\theta 2 \neq 0°$ and the $\theta 2 \neq 180°$. The first and second side surfaces have the same normal direction substantially perpendicular to the first direction. The substance between any two points in each of the first and second side surfaces is non-metal.

In some embodiments, the protruding first lead further comprises a plurality of first abutting surfaces, a plurality of first connecting surfaces, and a first end surface. The first abutting surfaces are connected to the first end surface through the first connecting surfaces. An abutment between the first abutting surface and the corresponding first connecting surface defines an interfacial line, and an abutment between at least one of the first connecting surfaces and the first end surface defines another interfacial line.

In some embodiments, one of the first abutting surfaces is abutted against the first side surface and is slanted to the first side surface by the first angle $\theta 1$, and another one of the first abutting surfaces is abutted against the second side surface and is slanted to the second side surface by the second angle $\theta 2$.

In some embodiments, the first and second side surfaces are respectively abutted against two ends of the protruding second lead with a third angle $\theta 3$ and a fourth angle $\theta 4$. The angles follow the according relationship: the $\theta 3 \neq 0°$ and the $\theta 3 \neq 180°$, as well as the $\theta 4 \neq 0°$ and the $\theta 4 \neq 180°$.

In some embodiments, the protruding second lead further comprises a plurality of second abutting surfaces, a plurality of second connecting surfaces, and a second end surface. The second abutting surfaces are connected to the second end surface through the second connecting surfaces. An abutment between the second abutting surface and the corresponding second connecting surface defines an interfacial line, and an abutment between at least one of the second connecting surfaces and the second end surface defines another interfacial line.

In some embodiments, one of the second abutting surfaces is abutted against the first side surface and is slanted to the first side surface by the third angle $\theta 3$, and another one of the second abutting surfaces is abutted against the second side surface and is slanted to the second side surface by the fourth angle $\theta 4$.

An aspect of the present disclosure provides a light-emitting device including a frame and a light-emitting component. The portions of the first and second leads exposed from the opening are electrically insulated from each other by at least one portion of the body. A light-emitting component is disposed within the opening of the body and includes at least one light source, a first electrode, and a second electrode. The first and second electrodes are electrically connected to the exposed portions of the first and second leads respectively.

An aspect of the present disclosure provides a method for manufacturing a light-emitting device including steps as follows. A mother substrate is cut along a cutting surface such that two frames of the mother substrate are separated from each other. The substance within an overlapping region between the mother substrate and the cutting surface is non-metal, and at least one of the two frames at least includes a metal material. A light-emitting component is disposed in at least one of the frames, and the light-emitting component is made electrically connect to the metal material of the corresponding frame.

BRIEF DESCRIPTION OF THE DRAWINGS

FIG. 1D is a side view of the frame illustrated in FIG. 1A;

FIG. 1E is a side view of the frame illustrated in FIG. 1A;

DETAILED DESCRIPTION

Figure 1A:
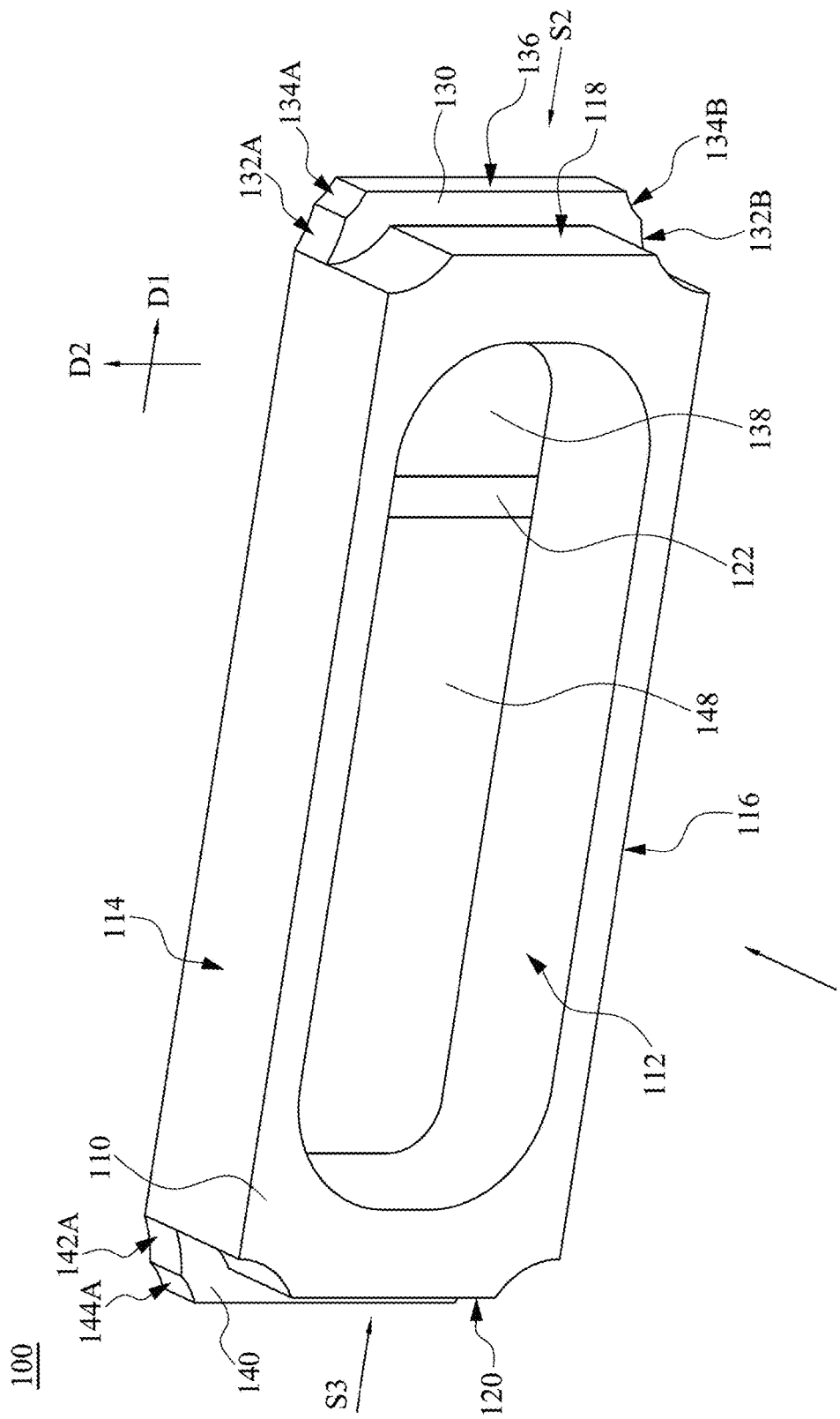
FIG. 1A is a front-side perspective view of a frame according to some embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1B:
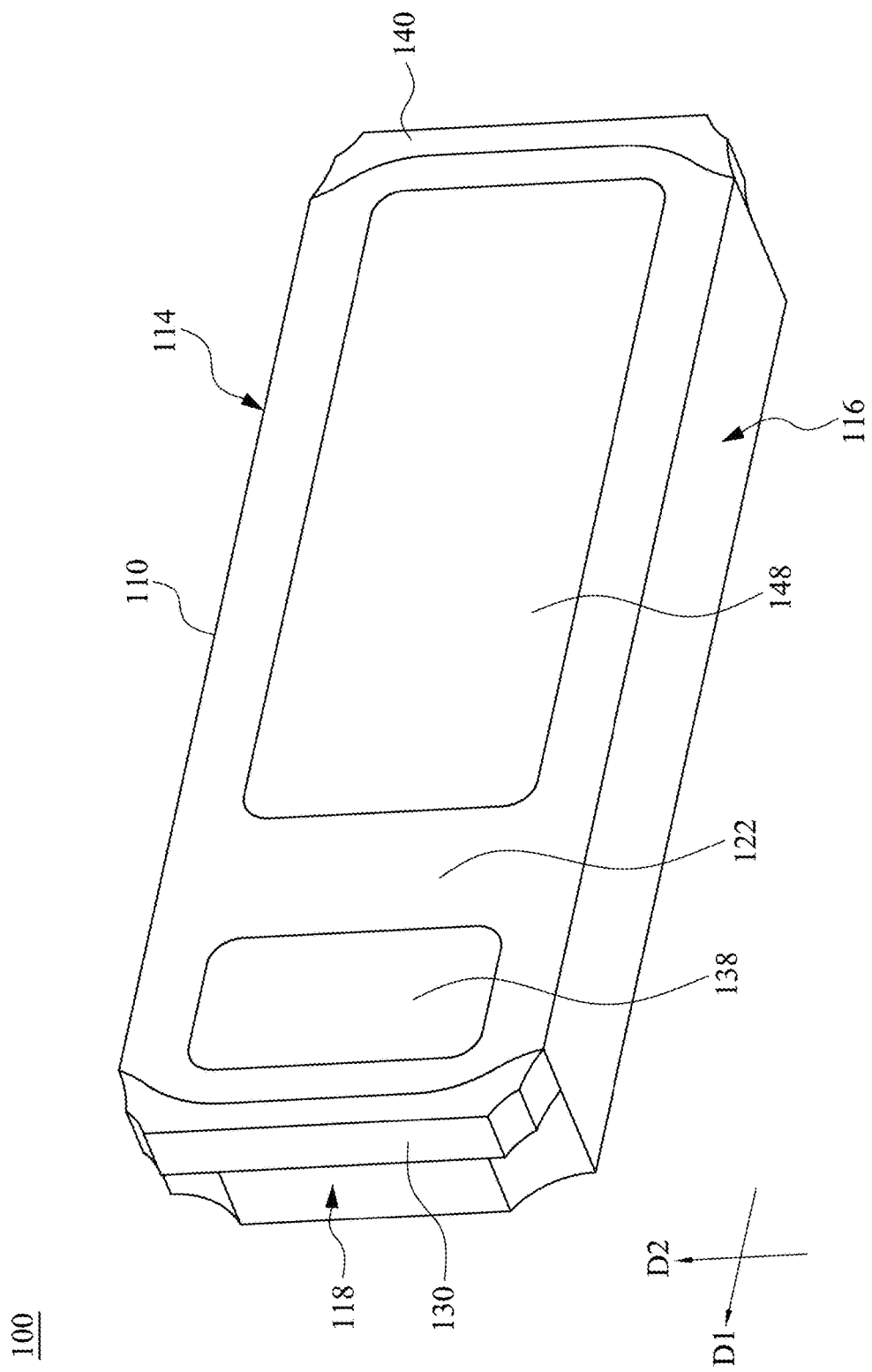
FIG. 1B is a back-side perspective view of the frame illustrated in FIG. 1A.
Figure 1C:
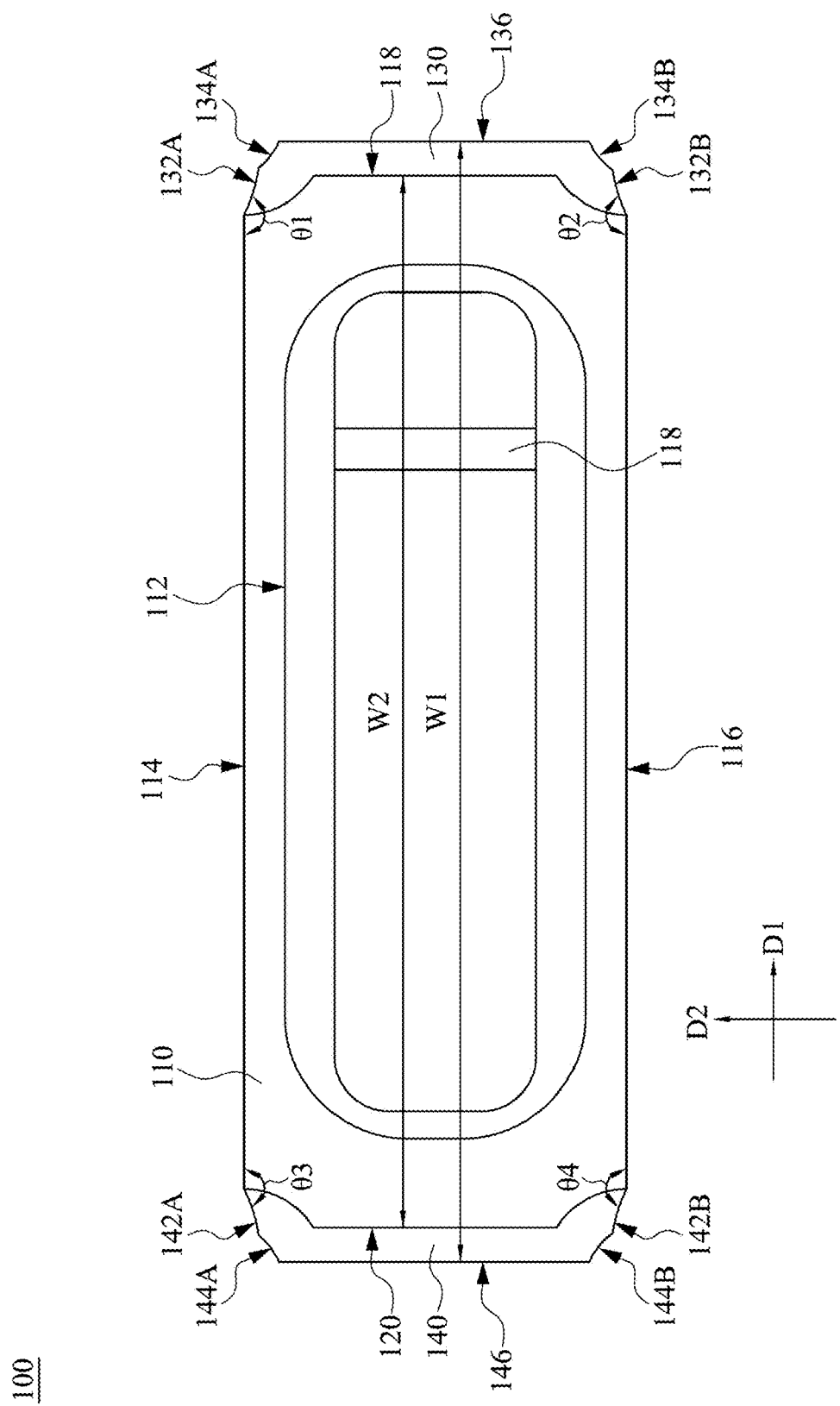
FIG. 1C is a front view of the frame illustrated in FIG. 1A.

FIG. 1A is a front-side perspective view of a frame 100 according to some embodiments of the present disclosure. FIG. 1B is a back-side perspective view of the frame 100 illustrated in FIG. 1A. FIG. 1C is a front view of the frame 100 illustrated in FIG. 1A, in which the frame 100 illustrated in FIG. 1C is viewed along an arrow S1 of FIG. 1A. In addition, for the convenience of explanation, a first direction D1 and a second direction D2 which are orthogonal to each other are illustrated in FIGS. 1A, 1B, and 1C.

The frame 100 can be configured to carry a light-emitting component (not illustrated in FIGS. 1A to 1C) and serve to protect the light-emitting component. The frame 100 includes a body 110, a first lead 130, and a second lead 140. The body contains a non-metal material. In some embodiments, the body 110 is composed of a non-metal material. The non-metal material may include a thermosetting resinous material, such as epoxy molding compound (EMC), or a thermoplastic resinous material, such as poly-cyclohexane dimethylene terephthalate (PCT). The body 110 has an opening 112, a first side surface 114, a second side surface 116, a third side surface 118, and a fourth side surface 120. The first and second side surfaces 114 and 116 are parallel with each other and are located at two opposite sides of the opening 112, and the first and second side surfaces 114 and 116 have the same normal direction substantially perpendicular to the first direction D1. The third and fourth side surfaces 118 and 120 are parallel with each other and are located at two opposite sides of the opening 112, and the third and fourth side surfaces 118 and 120 have the same normal direction substantially perpendicular to the second direction D2.

The first and second leads 130 and 140 contain a metal material. In some embodiments, the first lead 130 can be composed of a metal material the same as the second lead 140, such as copper, copper alloy, brass, iron, or combinations thereof. The first and second leads 130 and 140 are covered with the body 110. The first and second leads 130 and 140 covered with the body 110 are not exposed or protruded from the first and second side surfaces 114 and 116. That is, substance between any two points in each of the first and second side surfaces 114 and 116 is non-metal. With such configuration, since the first and second leads 130 and 140 covered with the body 110 are not exposed or protruded from the first and second side surfaces 114 and 116, the first and second leads 130 and 140 can be wrapped in the body 110 with the enhanced wrapping strength, thereby avoiding that the first and second leads 130 and 140 detach from the body 110.

A portion of the first lead 130 and a portion of the second lead 140 are exposed from the opening 112 of the body 110, and these portions of the first and second leads 130 and 140 exposed from the opening 112 are electrically insulated from each other by at least one portion of the body 110. For example, a first electrical connection portion 138 of the first lead 130 and a second electrical connection portion 148 of the second lead 140 are exposed from the opening 112, and the first and second electrical connection portions 138 and 148 are electrically insulated from each other by an insulation portion 122 of the body 110. When a light-emitting component is brought to combine with the frame 100, the light-emitting component can be disposed in the frame 100 through the opening 112, and the first and second leads 130 and 140 can be used to electrically connect the light-emitting component disposed in the frame 100. For example, FIG. 2 is a front view of a light-emitting device 200 assembled by combining the frame 100 illustrated in FIG. 1A and a light-emitting component 210.

Figure 2:
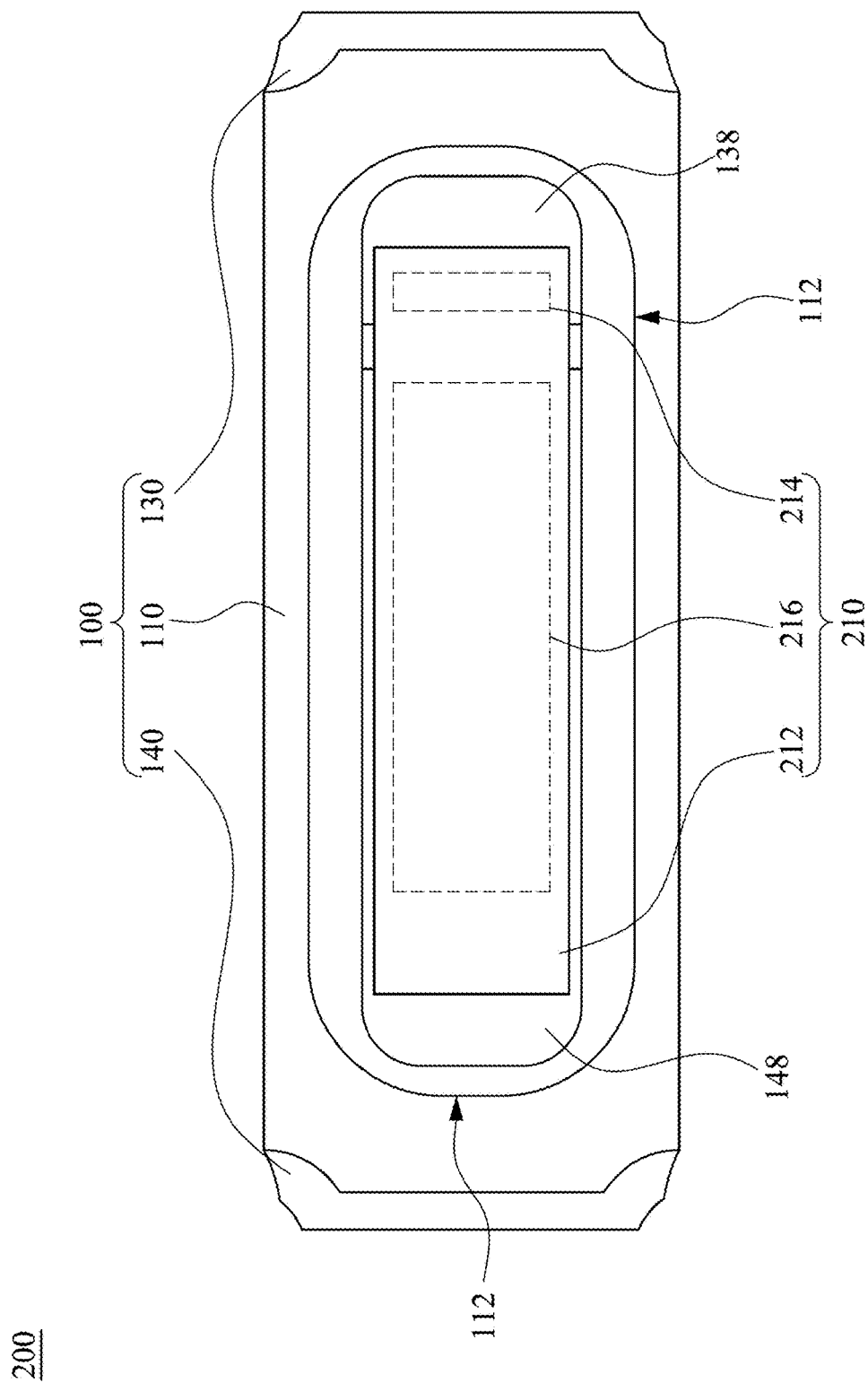
FIG. 2 is a front view of a light-emitting device assembled by combining the frame in FIG. 1A and a light-emitting component.

As shown in FIG. 2, the frame 100 can be combined with the light-emitting component 210, so as to collectively become the light-emitting device 200, in which the light-emitting component 210 may include at least one light-emitting chip. The light-emitting component 210 is disposed within the opening 112 of the body 110 and includes a light source 212, a first electrode 214, and a second electrode 216. The light source 212 may include a P-N junction connecting the first and second electrodes 214 and 216. The first and second electrodes 214 and 216 are electrically connected to the portions of the first and second leads 130 and 140 which are exposed from the opening 112. That is, the first and second electrodes 214 and 216 are respectively and electrically connected to the first electrical connection portion 138 of the first lead 130 and the second electrical connection portion 148 of the second lead 140. Under this configuration, as the first and second electrical connection portions 138 and 140 are biased, the light source 212 can be driven through the first and second electrodes 214 and 216, so as to emit light.

Reference is made to FIGS. 1A, 1B, and 1C, the first and second leads 130 and 140 can extend in the first direction D1 to outwardly protrude from the body 110. For example, FIG. 1D is a side view of the frame 100 illustrated in FIG. 1A, in which the frame 100 illustrated in FIG. 1D is viewed along an arrow S2 of FIG. 1A. As shown in FIGS. 1A and 1D, the protruding first lead 130 includes two first abutting surfaces 132A and 132B, two first connecting surfaces 134A and 134B, and a first end surface 136. The first end surface 136 of the first lead 130 can be parallel with the third and fourth side surfaces 118 and 120 of the body 110, and a normal direction of the first end surface 136 is substantially perpendicular to the second direction D2. The first abutting surfaces 132A and 132B can be connected to the first end surface 136 through the first connecting surfaces 134A and 134B, respectively. Furthermore, an abutment between one of the first abutting surfaces 132A and 132B and the corresponding one of the first connecting surfaces 134A and 134B can define an interfacial line. Similarly, an abutment between at least one of the first connecting surfaces 134A and 134B and the first end surface 136 can define an interfacial line as well.

FIG. 1E is a side view of the frame 100 illustrated in FIG. 1A, in which the frame 100 illustrated in FIG. 1E is viewed along an arrow S3 of FIG. 1A. As shown in FIGS. 1A and 1E, the protruding second lead 140 includes two second abutting surfaces 142A and 142B, two second connecting surfaces 144A and 144B, and a second end surface 146. The second end surface 146 of the second lead 140 can be parallel with the third and fourth side surfaces 118 and 120, and a normal direction of the second end surface 146 is substantially perpendicular to the second direction D2. The second abutting surfaces 142A and 142B can be connected to the second end surface 146 through the second connecting surfaces 144A and 144B, respectively. Furthermore, an abutment between one of the second abutting surfaces 142A and 142B and the corresponding one of the second connecting surfaces 144A and 144B can define an interfacial line. Similarly, an abutment between at least one of the second connecting surfaces 144A and 144B and the second end surface 146 can define an interfacial line as well.

Reference is made to FIG. 1C. Since the first and second leads 130 and 140 extend in the first direction D1 to outwardly protrude from the body 110, a vertical distance W1 from the first end surface 136 of the first lead 130 to the second end surface 146 of the second lead 140 is greater than a vertical distance W2 from the third side surface 118 to the fourth side surface 120 of the body 110. Furthermore, the first and second side surfaces 114 and 116 are respectively abutted against two ends of the protruding first lead 130, and an angle of each abutment therebetween is not a straight angle. For example, in a connection relationship between the first side surface 114 and the first abutting surface 132A, the first side surface 114 can be slanted to the first abutting surface 132A by a first angle θ1, in a relationship which the first angle θ1≠0° and the first angle θ1≠180°. In the present embodiment, the first angle θ1 is an obtuse angle. Similarly, in a connection relationship between the second side surface 116 and the first abutting surface 132B, the second side surface 116 can be slanted to the first abutting surface 132B by a second angle θ2, in a relationship which the second angle θ2≠0° and the second angle θ2≠180°. In the present embodiment, the second angle θ2 is an obtuse angle.

On the other hand, similarly to the first lead 130, the first and second side surfaces 114 and 116 are respectively abutted against two ends of the protruding second lead 140 as well, and an angle of each abutment therebetween is not a straight angle. In a connection relationship between the first side surface 114 and the second abutting surface 142A, the first side surface 114 can be slanted to the second abutting surface 142A by a third angle θ3, in a relationship which the third angle θ3≠0° and the third angle θ3≠180°. In the present embodiment, the third angle θ3 is an obtuse angle. Similarly, in a connection relationship between the second side surface 116 and the second abutting surface 142B, the second side surface 116 can be slanted to the second abutting surface 142B by a fourth angle θ4, in a relationship which the fourth angle θ4≠0° and the fourth angle θ4≠180°. In the present embodiment, the fourth angle θ4 is an obtuse angle. Moreover, the degrees of the first, second, third, and the fourth angles θ1, θ2, θ3, and θ4 may be the same.

Figure 3:
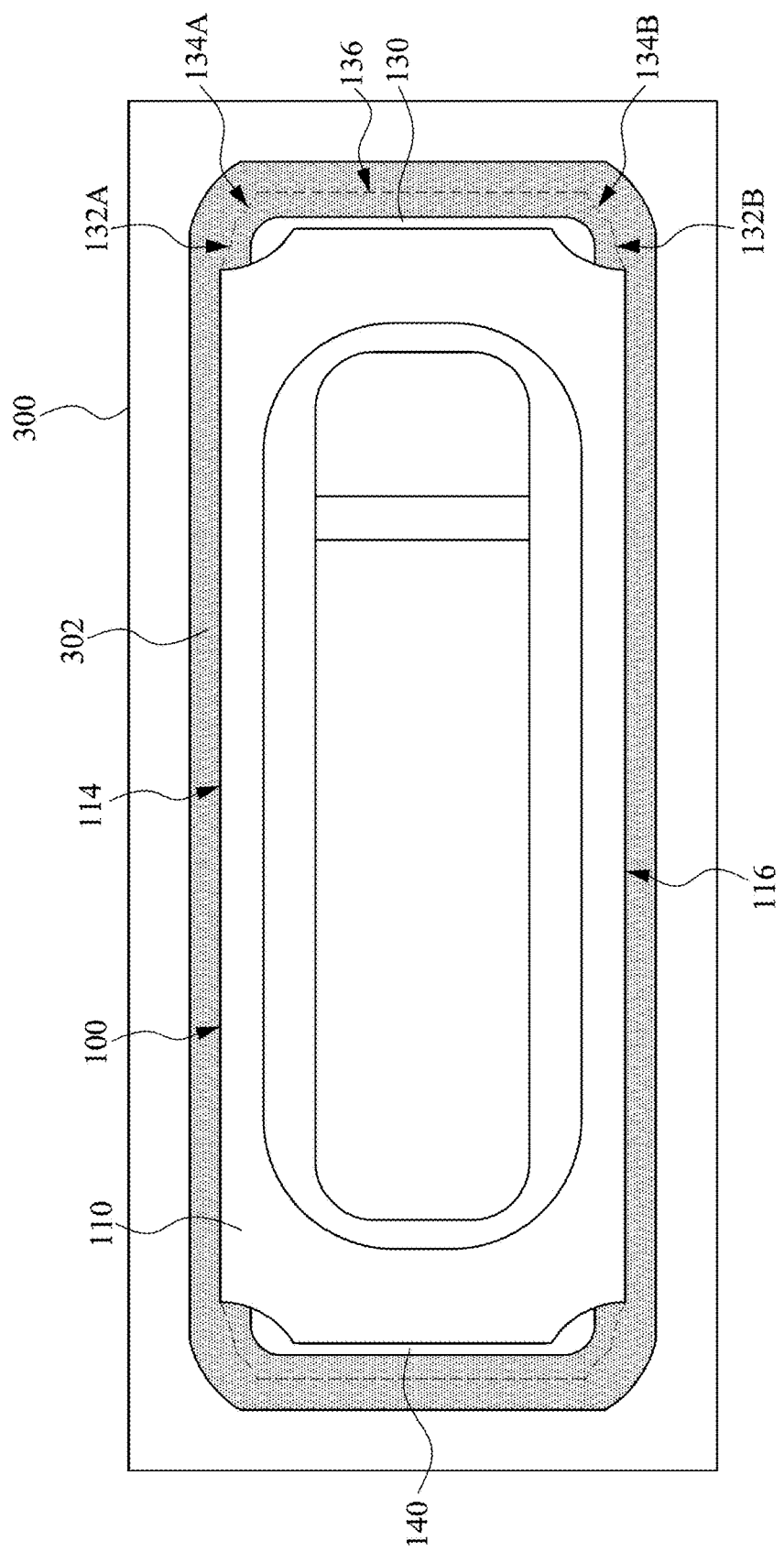
FIG. 3 is a front view of a configuration that the frame illustrated in FIG. 1A is fixed at a substrate.

With the above configuration, when the frame 100 is connected to and fixed at a substrate by an adhesive, the frame 100 can be securely connected to the substrate. In some embodiments, the substrate may be a circuit board, and the adhesive maybe at least one tin paste. For example, FIG. 3 is a front view of a configuration that the frame 100 illustrated in FIG. 1A is fixed at a substrate 300. When the frame 100 is brought to fix at the substrate 300, a adhesive 302 can be applied to a space between the frame 100 and the substrate 300. Then, the frame 100 is put on the substrate 300 with the opening 112 opposite to the substrate 300.

After the adhesive 302 is squeeze by the frame 100 and substrate 300, the adhesive 302 may outwardly overflow from the space between the frame 100 and substrate 300. Then, at least one portion of the overflowing adhesive 302 can extend or flow from the frame 100 toward the substrate 300 and then cover the first and second leads 130 and 140. For example, the portion of the overflowing adhesive 302 may cover at least one of the first abutting surfaces 132A and 132B, the first connecting surfaces 134A and 134B, and the first end surface 136 of the first lead 130. Since the first and second leads 130 and 140 outwardly protrude from the body 110, the portion of the overflowing adhesive 302 may further flow to top surfaces of the first and second leads 130 and 140, in which the top surfaces of the first and second leads 130 and 140 are opposite to the substrate 300. By the adhesive 302 flowing to the top surfaces of the first and second leads 130 and 140, the frame 100 can be securely fixed on the substrate 300. Furthermore, although the boundary or covering area of the overflowing adhesive 302 illustrated in FIG. 3 is similar to a rectangle, this particular boundary or covering area is not required but can be changed in different embodiments. For example, the boundary or covering area of the overflowing adhesive 302 may be other shapes. On the other hand, the covering area of the adhesive 302 outwardly overflowing from the space between the frame 100 and substrate 300 may be varied due to the different amount of the adhesive 302.

In addition, in a space between the first end surface 136 of the first lead 130 and the first side surface 114 of the body 110, since the first lead 130 has more than one surface therebetween, the contact area between the first lead 130 and the adhesive 302 can increase. That is, the first lead 130 can increase the contact area with the adhesive 302 through the first abutting surface 132A and the first connecting surface 134A. Accordingly, in addition to increasing the bonding strength therebetween, a case that the lead may slide due to the flow of the adhesive (e.g., heated tin paste) can be improved. Furthermore, since the angle of each abutment of the first and second side surfaces 114 and 116 of the body 110 and the first and second leads 130 and 140 is not a straight angle and the obtuse angle is between the first abutting surface 132A and the first connecting surface 134A (or between the first abutting surface 132B and the first connecting surface 134B), the slope change of the adjacent surfaces between the first side surface 114 and the first end surface 136 can be reduced. Accordingly, portions of the adhesive 302 covering the first abutting surface 132A and the first connecting surface 134A (or covering the first abutting surface 132B and the first connecting surface 134B) may tend to connect with each other. That is, the adhesive 302 may not be divided into more than one portion. In this case, the bonding strength of the adhesive 302 with respect to the frame 100 can be enhanced.

In some embodiments, the frame of the present disclosure can be obtained by cutting a mother substrate. Under the configuration that each of the side surfaces of the body is slanted to the corresponding abutting surface of the leads by a non-straight angle, a cutting step can be achieved with separating the non-metal material. For example, FIG. 4 is a front view of a step that cutting a mother substrate 400 along a cutting surface 402.

Figure 4:
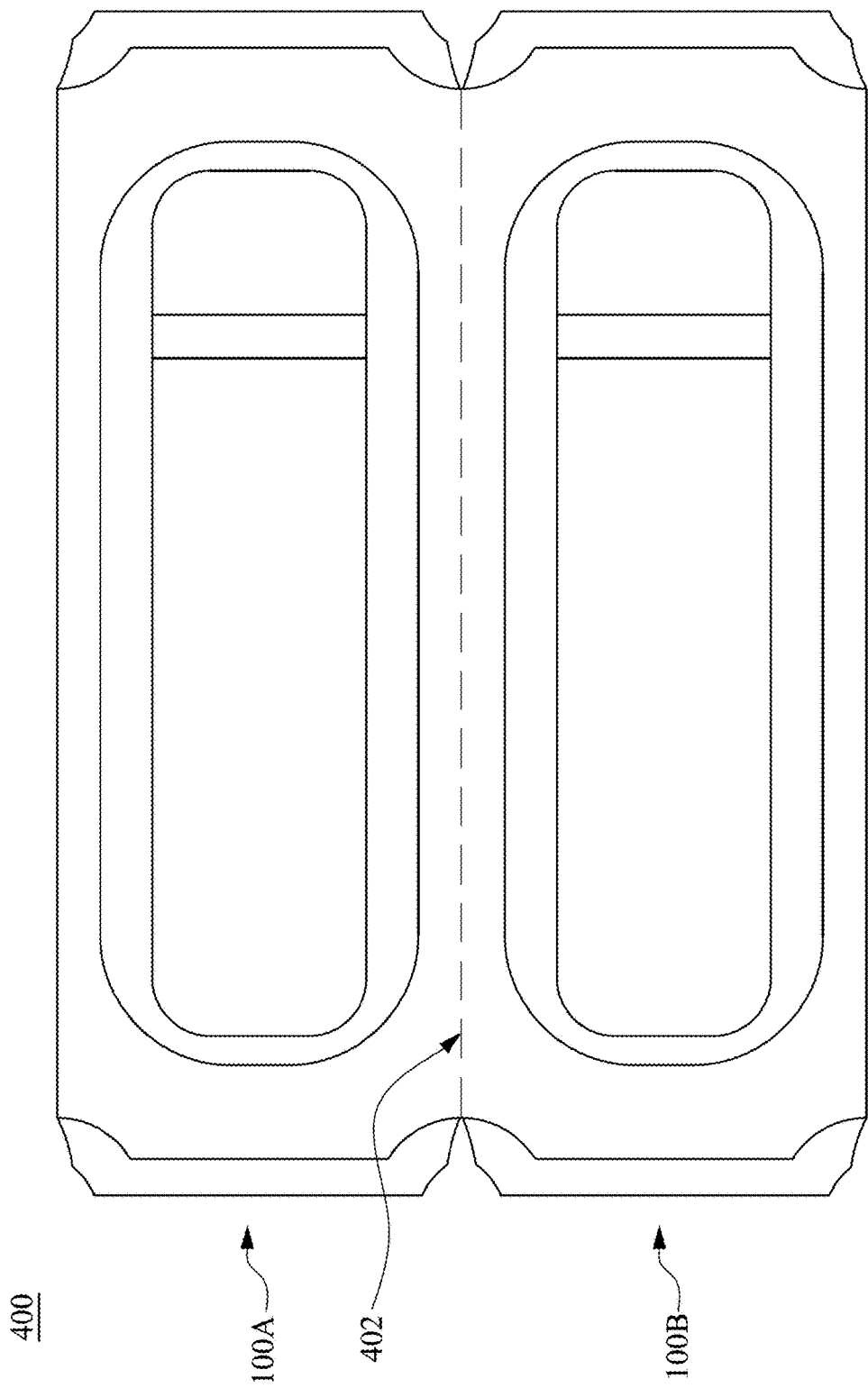
FIG. 4 is a front view of a step that cutting a mother substrate along a cutting surface.

As shown in FIG. 4, the mother substrate 400 includes two frames 100A and 100B connecting with each other, in which each of the frames 100A and 100B has a structure similar to that of the frame 100 of FIG. 1A. During the cutting step of the mother substrate 400, defining a cutting region between the frames 100A and 100B can be performed in the beginning. For example, the cutting surface 402 can be defined as the cutting region, in which substance within an overlapping region between the mother substrate 400 and the cutting surface 402 is non-metal. Then, the mother substrate 400 is cut along the cutting surface 402, such that the frames 100A and 100B of the mother substrate 400 are separated from each other. During the cutting step performed by a cutting tool, since the substance within the overlapping region between the mother substrate 400 and the cutting surface 402 is non-metal, the cutting region passed through by the cutting tool is non-metal. In other words, although at least one of the frames 100A and 100B connecting with each other at least includes a metal material, the cutting tool may not contact with this metal portion of the frames 100A and 100B during the cutting step. Accordingly, the wear and tear of the cutting tool can be reduced, thereby extending the useful life of the cutting tool. After the cutting step, a light-emitting component (e.g., the light-emitting component 210 of FIG. 2) can be disposed in the frame 100A or 100B through an opening (e.g., the opening 112 of FIG. 1A), and the light-emitting component is electrically connected to first and second leads (e.g., the first and second leads 130 and 140 of FIG. 1A) of the frame 100A or 100B. Then, the light-emitting device 200 of FIG. 2 is obtained.

As described above, the frame of the present disclosure can be configured to carry the light-emitting component, thereby serving to protect the light-emitting component. The frame includes the first lead, the second lead, and the body. The body is made of the non-metal material, and the first and second leads are made of the metal material. The first and second leads are covered with the body. The body has the opening and the first and second side surfaces, in which the first and second side surfaces are located at the two opposite sides of the opening. The substance between any two points in each of the first and second side surfaces is non-metal, thereby enhancing the wrapping strength of the body with respect to the first and second leads. Furthermore, the first and second side surfaces of the body are abutted against the ends of the first and second leads with non-straight angle, thereby enhancing the bonding strength of the adhesive with respect to the frame.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of present disclosure provided they fall within the scope of the following claims.

What is claimed is:

1. A frame, comprising:
a first lead and a second lead contain a metal material; and
a body containing a non-metal material and having an opening, a first side surface, and a second side surface, wherein the first and second leads are covered by the body, a portion of the first lead and a portion of the second lead are exposed from the opening, the first and second leads extend in a first direction to outwardly protrude from the body, the first and second side surfaces are located at two opposite sides of the opening, wherein the first and second side surfaces are respectively abutted against two ends of the protruding first lead with a first angle $\theta 1$ and a second angle $\theta 2$, where the $\theta 1 \neq 0°$ and the $\theta 1 \neq 180°$, the $\theta 2 \neq 0°$ and the $\theta 2 \neq 180°$, wherein the first and second side surfaces have the same normal direction substantially perpendicular to the first direction, and substance between any two points in each of the first and second side surfaces is non-metal.

2. The frame of claim 1, wherein the protruding first lead further comprises a plurality of first abutting surfaces, a plurality of first connecting surfaces, and a first end surface, the first abutting surfaces are connected to the first end surface through the first connecting surfaces, an abutment between the first abutting surface and the corresponding first connecting surface defines an interfacial line, and an abutment between at least one of the first connecting surfaces and the first end surface defines another interfacial line.

3. The frame of claim 2, wherein one of the first abutting surfaces is abutted against the first side surface and is slanted to the first side surface by the first angle $\theta 1$, and another one of the first abutting surfaces is abutted against the second side surface and is slanted to the second side surface by the second angle $\theta 2$.

4. The frame of claim 1, wherein the first and second side surfaces are respectively abutted against two ends of the protruding second lead and respectively slanted to the two ends of the protruding second lead by a third angle $\theta 3$ and a fourth angle $\theta 4$, the $\theta 3 \neq 0°$ and the $\theta 3 \neq 180°$, the $\theta 4 \neq 0°$ and the $\theta 4 \neq 180°$.

5. The frame of claim 4, wherein the protruding second lead further comprises a plurality of second abutting surfaces, a plurality of second connecting surfaces, and a second end surface, the second abutting surfaces are connected to the second end surface through the second connecting surfaces, an abutment between the second abutting surface and the corresponding second connecting surface defines an interfacial line, and an abutment between at least one of the second connecting surfaces and the second end surface defines another interfacial line.

6. The frame of claim 5, wherein one of the second abutting surfaces is abutted against the first side surface and is slanted to the first side surface by the third angle $\theta 3$, and another one of the second abutting surfaces is abutted against the second side surface and is slanted to the second side surface by the fourth angle $\theta 4$.

7. A light-emitting device, comprising:
a frame, comprising:
a first lead and a second lead containing a metal material; and
a body containing a non-metal material and having an opening, a first side surface, and a second side surface, wherein the first and second leads are covered with the body, a portion of the first lead and a portion of the second lead are exposed from the opening, the first and second leads extend in a first direction to outwardly protrude from the body, the first and second side surfaces are located at two opposite sides of the opening, wherein the first and second side surfaces are respectively abutted against two ends of the protruding first lead with a first angle $\theta 1$ and a second angle $\theta 2$, the $\theta 1 \neq 0°$ and the $\theta 1 \neq 180°$, the $\theta 2 \neq 0°$ and the $\theta 2 \neq 180°$, wherein the first and second side surfaces have the same normal direction substantially perpendicular to the first direction, and substance between any two points in each of the first and second side surfaces is non-metal, and the portions of the first and second leads exposed from the opening are electrically insulated from each other by at least one portion of the body; and a light-emitting component disposed within the opening of the body and comprising at least one light source, a first electrode, and a second electrode, in which the first and second electrodes are electrically connected to the exposed portions of the first and second leads respectively.

8. The light-emitting device of claim 7, wherein the protruding first lead further comprises a plurality of first abutting surfaces, a plurality of first connecting surfaces, and a first end surface, the first abutting surfaces are connected to the first end surface through the first connecting surfaces, an abutment between the first abutting surface and the corresponding first connecting surface defines an interfacial line, and an abutment between at least one of the first abutting surfaces and the first end surface defines another interfacial line.

9. The light-emitting device of claim 8, wherein one of the first abutting surfaces is abutted against the first side surface and is slanted to the first side surface by the first angle $\theta 1$, and another one of the first abutting surfaces is abutted against the second side surface and is slanted to the second side surface by the second angle $\theta 2$.

10. The light-emitting device of claim 7, wherein the first and second side surfaces are respectively abutted against two ends of the protruding second lead with a third angle $\theta 3$ and a fourth angle $\theta 4$, the $\theta 3 \neq 0°$ and the $\theta 3 \neq 180°$, the $\theta 4 \neq 0°$ and the $\theta 4 \neq 180°$.

11. The light-emitting device of claim 10, wherein the protruding second lead further comprises a plurality of second abutting surfaces, a plurality of second connecting surfaces, and a second end surface, the second abutting surfaces are connected to the second end surface through the second connecting surfaces, an abutment between the second abutting surface and the corresponding second connecting surface defines an interfacial line, and an abutment between at least one of the second abutting surfaces and the second end surface defines another interfacial line.

12. The light-emitting device of claim 11, wherein one of the second abutting surfaces is abutted against the first side surface and is slanted to the first side surface by the third angle $\theta 3$, and another one of the second abutting surfaces is abutted against the second side surface and is slanted to the second side surface by the fourth angle $\theta 4$.

* * * * *